United States Patent [19]

Humphrey et al.

[11] Patent Number: 5,201,956
[45] Date of Patent: Apr. 13, 1993

[54] CELLULAR TUMBLE COATER

[75] Inventors: Bruce J. Humphrey, Clear Lake; Roger A. Olson, Amery, both of Wis.

[73] Assignee: Specialty Coating Systems Inc., Danbury, Conn.

[21] Appl. No.: 904,643

[22] Filed: Jun. 26, 1992

[51] Int. Cl.$^5$ ............................................. C23C 16/00
[52] U.S. Cl. ................................ 118/716; 118/719; 118/724; 118/726; 118/730; 118/500
[58] Field of Search ............... 118/716, 719, 730, 724, 118/726, 500

[56] References Cited

U.S. PATENT DOCUMENTS

| | | | |
|---|---|---|---|
| 1,886,170 | 11/1932 | Cruser | 427/242 |
| 3,300,332 | 1/1967 | Gorham et al. | 423/274 |
| 3,517,644 | 6/1970 | Baer | 118/716 |
| 4,508,769 | 4/1985 | Olson et al. | 427/221 |
| 4,758,288 | 7/1988 | Versic | 149/6 |

FOREIGN PATENT DOCUMENTS 1257838 12/1938 United Kingdom.

*Primary Examiner*—Richard Bueker
*Attorney, Agent, or Firm*—W. K. Volles

[57] ABSTRACT

An apparatus is disclosed for coating articles with a coating material by vapor deposition wherein a cellular fixture is employed for tumble coating the articles. The cellular fixture comprises multiple cells disposed radially about a common axis of rotation. The cells comprise hollow members having side walls with a plurality of openings therethrough to permit the flow of vapors of coating material, e.g. parylene, through the openings into the cells.

16 Claims, 2 Drawing Sheets

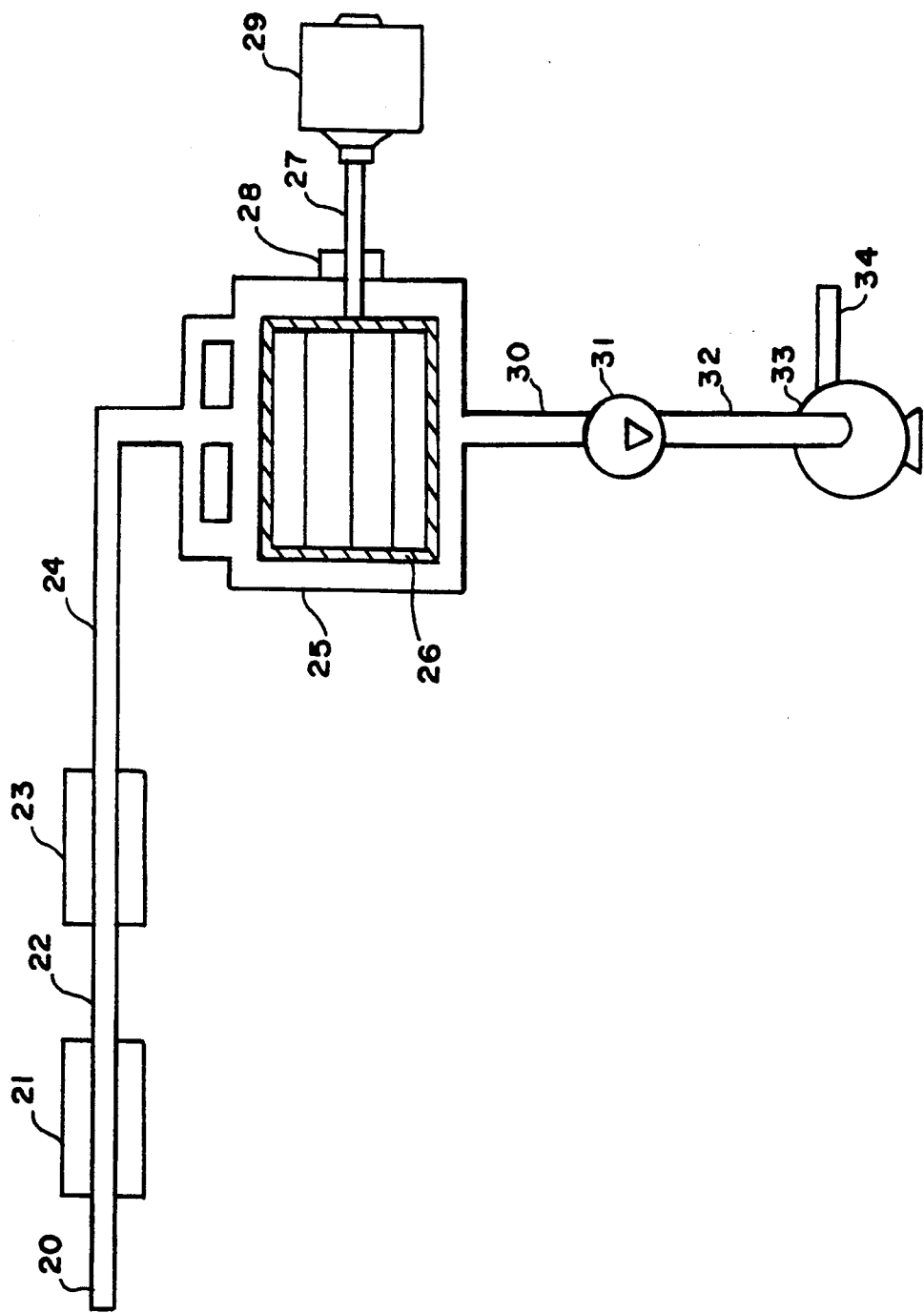

CELLULAR TUMBLE COATER

FIELD OF THE INVENTION

The present invention relates to an apparatus for coating articles by vapor deposition wherein the articles are tumbled in a fixture. More specifically, the present invention relates to a cellular fixture comprising multiple cells disposed radially about a common axis of rotation wherein each cell can contain a discrete quantity of articles to be coated.

BACKGROUND OF THE INVENTION

Coating materials, e.g. polymers, are often used as protective barriers on circuit boards, electrical components, medical devices and the like. Parylene is a generic term often used to describe a class of poly-p-xylylenes which are derived from a dimer of the structure:

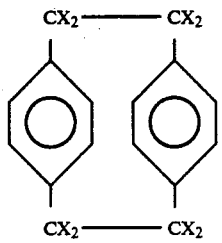

where X is typically hydrogen or a halogen. Due to its ability to provide thin films and conform to substrates of varied geometric shapes, parylene is ideally suited for use as a conformal coating.

Typically, parylene is applied by vapor deposition under vacuum conditions wherein the parylene monomer is condensed and Polymerized directly on the article to be coated. Since the parylene monomer is not stable, the parylene dimer, as illustrated above, is used as the starting material.

In most applications, parylene is deposited on articles by a pyrolytic deposition process which begins with the vaporization of the parylene dimer. The dimer is pyrolytically cleaved at temperatures of about 500° to 750° C. to form a reactive parylene monomer vapor. Thereafter, the reactive monomer vapor is transferred to a deposition chamber wherein the articles are located. Within the deposition chamber, the reactive monomer vapor condenses and polymerizes upon the articles to form a coating of parylene on the article. Any monomer vapor which fails to condense within the deposition chamber is typically removed by a cold trap which is maintained at cryogenic temperatures.

The process is generally carried out as a batch process in a closed apparatus under vacuum conditions, typically from about 10 to 50 millitorrs. Such an apparatus typically comprises separate zones for the (a) vaporization, (b) pyrolysis, and (c) deposition steps of the process, with such zones being connected by way of appropriate plumbing or tubular connections.

When it is desired to coat multiple articles, a tumble coating apparatus is often employed. In a tumble coating apparatus, the deposition chamber comprises a fixture for containing the articles, e.g., a drum, which is oriented horizontally and rotatably mounted within a housing (sometimes also referred to as a vacuum chamber). The articles to be coated are tumbled in the fixture during the coating process. Typically, small articles, such as ferrite cores used in the pulse transformer industry (known in the art as toroids), ferrite and permalloy bobbins used in the coil windings industry, headpole pieces used in the disc memory industry, small rotor and stator assemblies used in the automotive, aerospace and computer industries; mint coins, jewelry and the like, are coated in this manner.

Examples of common tumble coating apparatus are disclosed in U.S. Pat. No. 4,758,288 issued Jul. 19, 1988. In such apparatus, the fixtures resemble drums which have a solid wall construction, hereinafter referred to as a "drum system". The vaporized parylene monomer is typically introduced by a feed tube which extends into the rotating drum. Since the process is conducted under vacuum conditions, an open annulus is typically provided around the feed tube in order to allow communication between the inside of the drum and the housing where the vacuum is drawn. As a result, the presence of the open annulus limits the volume of articles that can be placed within the drum. Moreover, despite the presence of the annulus, a pressure gradient can be created between the drum and housing thereby restricting the gas flow within the drum. Such a Pressure gradient can result in an uneven coating thickness. Also, with such drum systems, it is often undesirable to increase the volume to accomodate more articles because the parylene coatings, and even the articles themselves, can be subjected to mechanical damage caused by the large volume of articles tumbling upon themselves.

Occasionally, it is desirable to coat several types of articles or different lots of the same article at one time. However, this cannot be conveniently done with a typical drum system, since the articles would be mixed during the tumbling.

In view of the limited capacity of typical drum systems, coating apparatus are desired which can provide increased capacity without causing mechanical damage to the articles being coated. In addition, improved fixtures having separate cells are desired to replace the drums so that different articles can be coated without intermixing. Furthermore, improved coating apparatus are desired which can provide a relatively constant pressure throughout the deposition chamber.

SUMMARY OF THE INVENTION

In accordance with the present invention, an apparatus for coating articles with a coating material by vapor deposition is provided which utilizes a cellular fixture for tumbling the articles. The cellular fixture comprises multiple cells disposed radially about a common axis of rotation. Each cell comprises (a) a hollow member having a side wall with a plurality of openings therethrough, the openings being large enough to permit vapors of the coating material to flow through the openings and being small enough to contain the articles within the cell; (b) a first end; and (c) a second end. In addition, in the cellular fixture of the present invention, the openings in the sidewalls of the cells are preferably generally aligned to provide communication between the adjacent cells and permit vapors of the coating material to flow from one cell through the sidewalls into an adjacent cell.

By virtue of the present invention, it is now possible to coat large volumes of articles in a tumble coating apparatus without causing mechanical damage to the articles. Often, as much as ten times the volume, or more, of articles coated with a typical drum system can be coated with the cellular fixture of the present invention because smaller volumes of articles can be contained within each cell. As a result, there is often less mechanical damage to the coating and the articles themselves with the cellular fixture of the present invention. In addition, the cellular fixture of the present invention can provide a relatively constant pressure throughout the deposition chamber because of the plurality of openings in the sidewalls of the cells and thereby provide more constant coating thicknesses on the articles. Moreover, different articles or different lots of the same article can be loaded in different cells and thus coated without intermixing.

BRIEF DESCRIPTION OF THE DRAWINGS

FIG. 2 is a schematic diagram of a vapor deposition apparatus in accordance with the present invention.

DETAILED DESCRIPTION OF THE INVENTION

Figure 1:
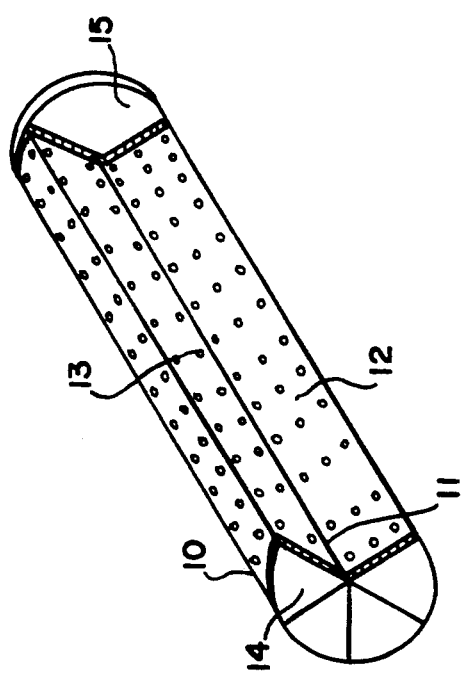
FIG. 1 is a perspective view of a cellular fixture in accordance with the present invention.

The invention is hereafter described with reference to the drawings which are presented for illustrative purposes and are not intended to limit the scope of the claims which follow.

FIG. 1 illustrates a cellular fixture for coating articles in accordance with the present invention. The cellular fixture comprises multiple cells 10 disposed radially about a common axis of rotation 11. Each cell comprises a hollow member 12 with a plurality of openings 13 through its sidewalls.

The geometries of the hollow members are not critical to the present invention. Preferably, the hollow members will have a circular, elliptical or triangular cross section. When hollow members having generally triangular cross sections are employed, it is preferred to arrange the hollow members such that the overall cellular fixture has a pie-shaped cross section. When the cellular fixture is fully loaded with triangular cells, the sum of the cross sectional areas of the cells will be approximately equal to the cross sectional area of the cellular fixture. Thus, cells with a triangular cross section are preferred. Even more preferred, are cells having a triangular cross section wherein the intersections, i.e. corners, are rounded to improve tumbling.

When a fully-loaded cellular fixture is employed, regardless of the cross sectional geometry, it is important to provide openings through the side walls of the cells which form the external surface of the cellular fixture in order to allow vapors of coating material to pass from the exterior to the interior of each cell. In some instances, e.g. when small volumes of articles are to be coated, it may not be desirable to operate the cellular fixture with a full load of cells. Thus, in some instances, it may be desirable to operate a cellular fixture designed, for example, to accommodate eight cells with only two of the cells installed.

The geometries of the openings in the sidewalls of the hollow members are also not critical to the present invention. However, the openings should be large enough to permit vapors of the coating material to flow through the openings and also be small enough to contain the articles within the cell. Preferably, the openings are also large enough to avoid creating any significant pressure drop through the openings which may inhibit transfer of the gas through the sidewall. Even more preferably, the openings are just small enough to prevent the articles from falling out of the cell.

In addition, it is preferred that the openings in the sidewalls of adjacent cells are generally aligned to provide communication, i.e. open communication, between the adjacent cells in order to permit vapors of the coating material to flow between adjacent cells, i.e. from one cell through the sidewalls and into the adjacent cell. It is further preferred that the sidewalls of the hollow members have an open area of at least about 30 percent; more preferably, at least about 60 percent; and most preferably, at least about 80 percent. Thus, in a preferred aspect of the invention, substantially the entire surface of each hollow member has openings therethrough.

The hollow members can be comprised of any suitable materials having properties sufficient to withstand the conditions of the vapor deposition coating process. Typically, the hollow members will be comprised of sheet metal, e.g. steel or aluminum, with multiple perforations therethrough, or screen or wire cloth, e.g. one-quarter-inch hardware cloth. Additionally, the hollow members can be comprised of plastic or composite materials.

Articles can be loaded and removed from the cells by any convenient means. As shown in FIG. 1, end caps 14 can be provided as a closure means on the ends of the hollow members. Such end caps can be completely removable from the hollow members or can have hinged lids, for example. The materials of construction of such end caps are not critical to the present invention. High-density polyethylene is one suitable material for use as an end cap. Alternately, articles can be loaded and removed from the cells by providing a closure means along the sidewall of the hollow member, such as for example, by providing a hinged opening along the axial dimension of the hollow member.

The individual cells are preferably connected to the cellular fixture in a manner such that they can be conveniently removed. In FIG. 1, an end plate 15 is shown which is rigidly connected to common axis 11. Each cell is connected by affixing the end cap to the end plate by suitable means, e.g., bolting. Often, the cellular fixture will comprise another end plate (not shown) at the opposite end of the fixture. It is also possible, for example, to affix the cells to the common axis of rotation.

The number of cells in the cellular fixture is preferably from 2 to 16, and more preferably from 4 to 8. In addition, each cell can be further subdivided to create compartments within the cell.

FIG. 2 illustrates an apparatus for coating articles with a coating material by vapor deposition under vacuum conditions in accordance with the present invention.

FIG. 2 is hereafter described with reference to parylene as the coating material, although those skilled in the art will recognize that other polymers may exist, now or in the future, which are suitable for use as coating materials in the apparatus of the present invention. Parylene dimer, the starting material, is commercially available from a variety of sources, e.g., Union Carbide Chemical and Plastics Company Inc., Danbury, CT.

Parylene dimer is introduced to the apparatus by a line 20 which is connected to a vaporization zone 21 wherein the parylene dimer is vaporized. The vaporization zone comprises a heater which is capable of vaporizing the parylene at typical pressures used in the coating process. The temperature in the vaporization zone typically ranges from about 80° to about 200° C.

Vaporized parylene dimer is passed from the vaporization zone by a line 22 to a pyrolysis zone 23 wherein the parylene dimer is pyrolyzed to form the parylene monomer. The pyrolysis zone comprises a heater which is capable of pyrolyzing the parylene dimer at typical pressures used in the parylene process. The temperature in the pyrolysis zone typically ranges from about 500° to 750° C., preferably from about 650° to 750° C. and more preferably from about 680° to 700° C.

Parylene monomer is passed from the pyrolysis zone by a line 24 to a housing 25 which encloses cellular fixture 26 which contains eight cells and is substantially the same as described with reference to FIG. 1. Cellular fixture 26 is positioned within housing 25 to have a generally horizontal orientation and is rotated by drive shaft 27 which is rigidly connected at one end to cellular fixture 26. The other end of drive shaft 27 extends through housing 25, through a vacuum seal 28 and is rigidly connected to drive motor 29.

Since the process is conducted under vacuum conditions, a means for creating a vacuum within the housing is provided.

A suction line 30, in communication with housing 25, is connected to a cryogenic condensation trap 31 wherein residual vapors of parylene monomer are condensed, polymerized and isolated. One suitable cryogenic fluid for use in the condensation trap is liquid nitrogen.

Residual vapor from condensation trap 31 is withdrawn by a line 32 and passed through a vacuum pump 33. The vacuum pump operates in order to provide subatmospheric pressure in the housing and fixture and preferably provide a pressure of from about 10 to 50 millitorrs. The discharge from the vacuum pump is withdrawn from the apparatus by a line 34.

In accordance with the present invention, vacuum conditions are established within each cell of the cellular fixture by providing communication with the vacuum in the housing through the plurality of openings in the side walls of the cells. Accordingly, it is no longer necessary to provide a feed tube extending into the fixture with an open annulus around the feed tube as in the typical drum systems. As a result, it is now possible to substantially fill each of the cells with articles to be coated. The only requirement is that the articles have sufficient mobility within the cells during tumbling to be coated with the coating material. Often as much as ten times the volume, or more, of articles coated in a typical drum system can be tumble coated in the cellular fixture of the present invention.

In addition, there is often a more constant pressure profile in the deposition chamber of the present invention, thereby providing uniform coating thickness on the coated articles.

EXAMPLES

A cellular fixture was constructed using eight cells, each of which had hollow members made from one-quarter inch welded steel wire with a generally triangular cross section. The end caps were made from high-density polyethylene. When fully loaded with the eight cells, the cellular fixture had a generally circular cross section and had a cylindrical geometry. The dimensions of the cellular fixture were approximately 20 in. diameter and 27½ in. length. The cells were constructed so as to open along their axial dimension for ease of loading. This cellular fixture was used in the test run described below.

For comparison purposes, a base case run was also performed using a typical drum system. The drum had a cylindrical geometry and the dimensions were approximately 8 in. diameter and 20 in. length.

A vapor deposition apparatus such as described with reference to FIG. 2 was used for both runs.

For the base case run, approximately 4,500 ferrite cores having dimensions of one-half inch diameter by one-quarter inch thickness, which was the maximum load possible, were loaded in the drum system. Approximately 70 grams of Parylene C, a parylene dimer which was obtained from Union Carbide Chemicals and Plastics Company Inc., Danbury, Connecticut, were loaded into the vaporization section of the vapor deposition apparatus. The drum was rotated at one-fifth revolutions per minute. The vaporization zone was maintained at 150° C. and the pyrolysis zone was maintained at 690° C. The pressure within the housing was maintained at 40 millitorr. The run was terminated after about three hours when all of the Parylene C had vaporized.

For the test run using the cellular fixture of the present invention, approximately 5,625 of the ferrite cores used in the base case run were loaded into each of the eight cells for a total of approximately 45,000 ferrite cores, which is approximately ten times the maximum load of the drum system. Approximately 700 grams of the same Parylene C used in the comparison run was loaded into the vaporization zone. The cellular fixture was rotated at approximately one-sixth revolutions per minute. The temperature was maintained at 150° C. in the vaporization zone and 690° C. in the pyrolysis zone. The pressure within the housing was maintained at about 40 millitorr. The run was terminated after about five hours when all of the Parylene C had been vaporized.

At the conclusion of the two runs, articles coated in the cellular fixture and the drum system were compared and were found to have substantially similar coating thicknesses and evenness of coating. Test strips which were included during the run with the drum system had parylene coating thicknesses ranging from 11.5 to 15 microns indicating good parylene coating distribution. Test strips which were included during the run with the cellular fixture had parylene coating thicknesses ranging from 9 microns to 12 microns, also indicating good parylene distribution.

Although the invention has been described herein with respect to specific aspects, those skilled in the art will recognize that modifications and alterations may be made without departing from the spirit and the scope of the invention.

We claim:

1. A cellular fixture for coating articles with a coating material by vapor deposition, comprising multiple cells disposed radially about a common axis of rotation, each cell comprising:
   (a) a hollow member having a side wall with a plurality of openings therethrough, said openings being large enough to permit vapors of the coating material to flow through said openings and being small enough to contain the articles within the cell;
   (b) a first end; and
   (c) a second end.

2. The cellular fixture of claim 1 wherein said openings in the side walls of adjacent cells are generally aligned to provide communication between said adjacent cells to permit vapors of coating material to flow between said adjacent cells.

3. The cellular fixture of claim 1 wherein the side wall has an open area of at least about 30%.

4. The cellular fixture of claim 1 wherein the side wall has an open area of at least about 60%.

5. The cellular fixture of claim 1 wherein the side wall has an open area of at least about 80%.

6. The cellular fixture of claim 1 having from 2 to 16 cells.

7. The cellular fixture of claim 1 having from 4 to 8 cells.

8. The cellular fixture of claim 1 wherein at least one of said first end and second end has a closure means positionable between an open position and a closed position for loading and removing the articles from the cells.

9. The cellular fixture of claim 1 wherein the hollow member has a circular cross section.

10. The cellular fixture of claim 1 wherein the hollow member has an elliptical cross section.

11. The cellular fixture of claim 1 wherein the hollow member has a triangular cross section.

12. The cellular fixture of claim 1 wherein the coating material is parylene.

13. An apparatus for coating articles with parylene by vapor deposition under vacuum conditions, comprising
 i) a housing;
 ii) a cellular fixture comprising multiple cells disposed radially about a common axis of rotation, each cell comprising:
  (a) a hollow member having a side wall with a plurality of openings therethrough, said openings being large enough to permit vapors of parylene to flow through said openings and being small enough to contain the articles within the cell;
  (b) a first end; and
  (c) a second end; said cellular fixture being rotatably mounted within said housing;
 iii) means for creating a vacuum within said housing; and
 iv) means for introducing vaporized parylene into said housing.

14. The apparatus of claim 13 wherein the means for introducing vaporized parylene into said housing comprises a vaporization zone to which parylene dimer can be introduced, a pyrolysis zone connected to the vaporization zone, and a feed line connected to the pyrolysis zone and said housing.

15. In an apparatus for coating articles with parylene by vapor deposition under vacuum conditions, comprising:
 i) a vaporization zone to which parylene dimer can be introduced;
 ii) a pyrolysis zone connected to the vaporization zone;
 iii) a housing connected to the pyrolysis zone;
 iv) a fixture for tumbling the articles rotatably mounted within the housing; and
 v) means for creating a vacuum within the housing;
the improvement wherein the fixture is a cellular fixture comprising multiple cells disposed radially about a common axis of rotation, each cell comprising:
 (a) a hollow member having a side wall with a plurality of openings therethrough, said openings being large enough to permit vapors of parylene to flow through said openings and being small enough to contain the articles within the cell;
 (b) a first end, and
 (c) a second end.

16. The apparatus of claim 15 wherein said openings in the side walls of adjacent cells are generally aligned to provide communication between said adjacent cells to permit vapors of parylene to flow between said adjacent cells.

* * * * *